(12) United States Patent
Hatada et al.

(10) Patent No.: US 12,283,615 B2
(45) Date of Patent: Apr. 22, 2025

(54) SEMICONDUCTOR DEVICE WITH MULTIPLE ELECTRODES AND AN INSULATION FILM

(71) Applicants: Kabushiki Kaisha Toshiba, Tokyo (JP); Toshiba Electronic Devices & Storage Corporation, Tokyo (JP)

(72) Inventors: Hiroki Hatada, Kanazawa Ishikawa (JP); Kohei Oasa, Setagaya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 540 days.

(21) Appl. No.: 17/669,309

(22) Filed: Feb. 10, 2022

(65) Prior Publication Data

US 2023/0085094 A1 Mar. 16, 2023

(30) Foreign Application Priority Data

Sep. 15, 2021 (JP) .................. 2021-150214

(51) Int. Cl.
*H01L 29/41* (2006.01)
*H01L 29/06* (2006.01)
(Continued)

(52) U.S. Cl.
CPC .... *H01L 29/41775* (2013.01); *H01L 29/0696* (2013.01); *H01L 29/404* (2013.01);
(Continued)

(58) Field of Classification Search
CPC ........... H01L 29/41775; H01L 29/0696; H01L 29/404; H01L 29/407; H01L 29/66734;
(Continued)

(56) References Cited

U.S. PATENT DOCUMENTS 8,431,998 B2 4/2013 Miyata
2010/0123220 A1 5/2010 Burke et al.
(Continued)

FOREIGN PATENT DOCUMENTS

JP 2002-203964 A 7/2002
JP 2010-177454 A 8/2010
(Continued)

*Primary Examiner* — Mohammad M Hoque
(74) *Attorney, Agent, or Firm* — Knobbe, Martens, Olson & Bear, LLP

(57) ABSTRACT

A semiconductor device includes: a second electrode, located in a semiconductor part, extending in a first direction; a third electrode, located in the semiconductor part, including a first portion, a second portion, and a first middle portion positioned below the second electrode between the first portion and the second portion, the second electrode being located between the first portion and the second portion in the first direction; a fourth electrode, located above the semiconductor part, including a pad portion separated from the second electrode and the second portion in a second direction, and a protrusion protruding from the pad portion and covering the second electrode and being connected to the second electrode; and a fifth electrode, located above the semiconductor part, including a first covering portion being connected to the first contact portion and a second covering portion being connected to the first portion.

7 Claims, 12 Drawing Sheets

(51) Int. Cl.
  *H01L 29/40* (2006.01)
  *H01L 29/417* (2006.01)
  *H01L 29/66* (2006.01)
  *H01L 29/78* (2006.01)

(52) U.S. Cl.
  CPC ...... *H01L 29/407* (2013.01); *H01L 29/66734* (2013.01); *H01L 29/7813* (2013.01)

(58) Field of Classification Search
  CPC ............. H01L 29/7813; H01L 29/7811; H01L 29/42372
  USPC ....................................................... 257/330
  See application file for complete search history.

(56) References Cited

U.S. PATENT DOCUMENTS

| | | |
|---|---|---|
| 2010/0140695 A1 | 6/2010 | Yedinak et al. |
| 2012/0326207 A1 | 12/2012 | Yoshimochi |
| 2019/0081173 A1 | 3/2019 | Nishiwaki et al. |
| 2021/0057573 A1 | 2/2021 | Shimomura |
| 2022/0037523 A1* | 2/2022 | Oda ........................ H01L 29/78 |

FOREIGN PATENT DOCUMENTS

| | | |
|---|---|---|
| JP | 2013-033931 A | 2/2013 |
| JP | 2019-054071 A | 4/2019 |

\* cited by examiner

SEMICONDUCTOR DEVICE WITH MULTIPLE ELECTRODES AND AN INSULATION FILM

CROSS-REFERENCE TO RELATED APPLICATIONS

This application is based upon and claims the benefit of priority from Japanese Patent Application No. 2021-150214, filed on Sep. 15, 2021; the entire contents of which are incorporated herein by reference.

FIELD

Embodiments relate to a semiconductor device.

BACKGROUND

In a conventionally known structure of a semiconductor device such as a MOSFET (Metal-Oxide-Semiconductor Field-Effect Transistor) or the like in which a gate electrode and a FP (Field Plate) electrode are located inside a semiconductor part, an external gate electrode that is electrically connected to the gate electrode inside the semiconductor part and a source electrode that is electrically connected to the FP electrode are located at the surface of the semiconductor part.

DETAILED DESCRIPTION

Figure 1:
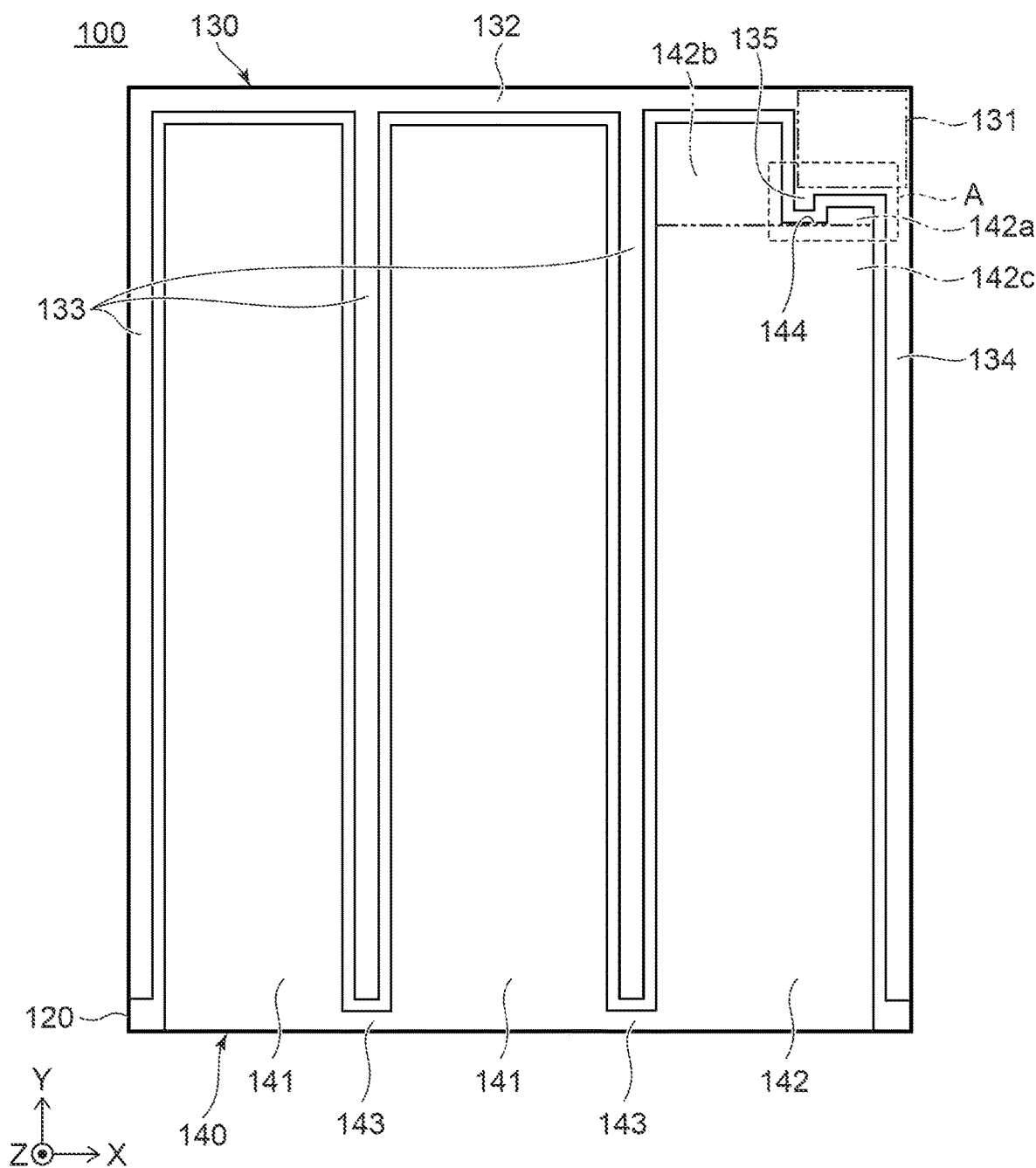
FIG. 1 is a top view showing a semiconductor device according to a first embodiment.

In general, according to one embodiment, a semiconductor device includes: a first electrode; a semiconductor part located on the first electrode; a second electrode located in the semiconductor part, the second electrode extending in a first direction when viewed from above; a third electrode located in the semiconductor part, the third electrode extending in the first direction, the third electrode including a first portion, a second portion, and a first middle portion positioned below the second electrode between the first portion and the second portion, the second electrode being located between the first portion and the second portion in the first direction; a fourth electrode located above the semiconductor part, the fourth electrode including a pad portion separated from the second electrode and the second portion in a second direction crossing the first direction when viewed from above, and a protrusion protruding from the pad portion and covering the second electrode, the protrusion being connected to the second electrode; a fifth electrode located above the semiconductor part and separated from the fourth electrode, the fifth electrode including a first covering portion covering a first contact portion of the semiconductor part adjacent to the second portion when viewed from above, the first covering portion being connected to the first contact portion, and a second covering portion covering the first portion, the second covering portion being connected to the first portion; and a first insulating film located between the semiconductor part and the second electrode, between the semiconductor part and the third electrode, and between the second electrode and the third electrode.

In general, according to one embodiment, a semiconductor device includes: a first electrode; a semiconductor part located on the first electrode; a second electrode located in the semiconductor part, the second electrode extending in a first direction when viewed from above; a third electrode, the second electrode including a first end portion in an opposite direction of the first direction, the third electrode including a portion next to the first end portion; a fourth electrode located in the semiconductor part, the fourth electrode being next to the first end portion of the second electrode in a second direction crossing the first direction when viewed from above, the fourth electrode extending in the first direction, a length in the first direction of the fourth electrode being less than a length in the first direction of the second electrode; a fifth electrode, the fourth electrode including a second end portion in the opposite direction of the first direction, the fifth electrode including a portion next to the second end portion in the first direction; a sixth electrode located above the semiconductor part, the sixth electrode being connected to the fourth electrode, the sixth electrode including a pad portion and a protrusion, the pad portion being separated from the second and fourth electrodes in the second direction, the protrusion protruding from the pad portion, the fourth electrode including a third end portion in the first direction, the protrusion covering the third end portion, the protrusion being connected to the third end portion; and a seventh electrode located above the semiconductor part, the seventh electrode being separated from the pad portion in an opposite direction of the second direction, the seventh electrode including a first covering portion and a second covering portion, a distance from the pad portion to the first covering portion in the second direction being greater than a distance between the fourth electrode and the pad portion in the second direction, the second covering portion covering the portion of the third electrode, the portion of the fifth electrode, and a first contact portion of the semiconductor part, the first contact portion being positioned between the second electrode and the fourth electrode, the second covering portion being connected to the portion of the third electrode, the portion of the fifth electrode, and the first contact portion; a first insulating film located between the semiconductor part and the second electrode, between the semiconductor part and the third electrode, and between the second electrode and the third electrode; and a second insulating film located between the semiconductor part and the fourth electrode, between the semiconductor part and the fifth electrode, and between the fourth electrode and the fifth electrode.

In general, according to one embodiment, a semiconductor device includes: a first electrode; a semiconductor part located on the first electrode; a second electrode located in the semiconductor part, the second electrode extending in a first direction when viewed from above; a third electrode located in the semiconductor part, the third electrode extending in the first direction, the third electrode including a first portion, a second portion, and a first middle portion, the second electrode including a first end portion in an opposite direction of the first direction, the first portion being next to the first end portion in the first direction, the second electrode including a second end portion in the first direction, the second portion being next to the second end portion in the first direction, the first middle portion being positioned below the second electrode between the first portion and the second portion; a fourth electrode located in the semiconductor part, the fourth electrode being next to the second electrode in a second direction crossing the first direction when viewed from above, the fourth electrode extending in the first direction; a fifth electrode located in the semiconductor part, the fourth electrode including a third end portion in the opposite direction of the first direction, the fifth electrode including a third portion that is next to the third end portion in the first direction; a sixth electrode located above the semiconductor part, the sixth electrode including a pad portion and a protrusion, the pad portion being separated in the second direction from the second and fourth electrodes, the protrusion protruding from the pad portion, the fourth electrode including a fourth end portion in the first direction, the protrusion covering the second end portion of the second electrode and the fourth end portion of the fourth electrode, the protrusion being connected to the second and fourth end portions, the protrusion not covering at least a portion of the second portion when viewed from above; a seventh electrode located above the semiconductor part and separated from the pad portion in an opposite direction of the second direction, the seventh electrode including a first covering portion and a second covering portion, a distance from the pad portion to the first covering portion in the second direction being greater than a distance between the fourth electrode and the pad portion in the second direction, the second covering portion covering the first portion, the third portion, and a first contact portion of the semiconductor part positioned between the second electrode and the fourth electrode, the second covering portion being connected to the first portion, the third portion, and the first contact portion; a first insulating film located between the semiconductor part and the second electrode, between the semiconductor part and the third electrode, and between the second electrode and the third electrode; and a second insulating film located between the semiconductor part and the fourth electrode, between the semiconductor part and the fifth electrode, and between the fourth electrode and the fifth electrode.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing therein-above are marked with like reference numerals, and a detailed description is omitted as appropriate.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". The direction of the arrow in the X-direction is taken as the "+X direction"; and the opposite direction is taken as the "−X direction". The direction of the arrow in the Y-direction is taken as the "+Y direction"; and the opposite direction is taken as the "−Y direction". Although the direction of the arrow in the Z-direction is taken as up and the opposite direction is taken as down, these directions are independent of the direction of gravity.

Hereinbelow, the notations of the + and − for each conductivity type indicate relative levels of the impurity concentrations of each conductivity type. Specifically, a notation marked with "+" indicates a higher impurity concentration than a notation not marked with either "+" or "−". A notation marked with "−" indicates a lower impurity concentration than a notation not marked with either "+" or "−". Here, when both an impurity that forms donors and an impurity that forms acceptors are included in each region, the "impurity concentration" means the net impurity concentration after the impurities cancel.

First Embodiment

First, a first embodiment will be described.

FIG. 1 is a top view showing a semiconductor device according to the embodiment.

Figure 2:
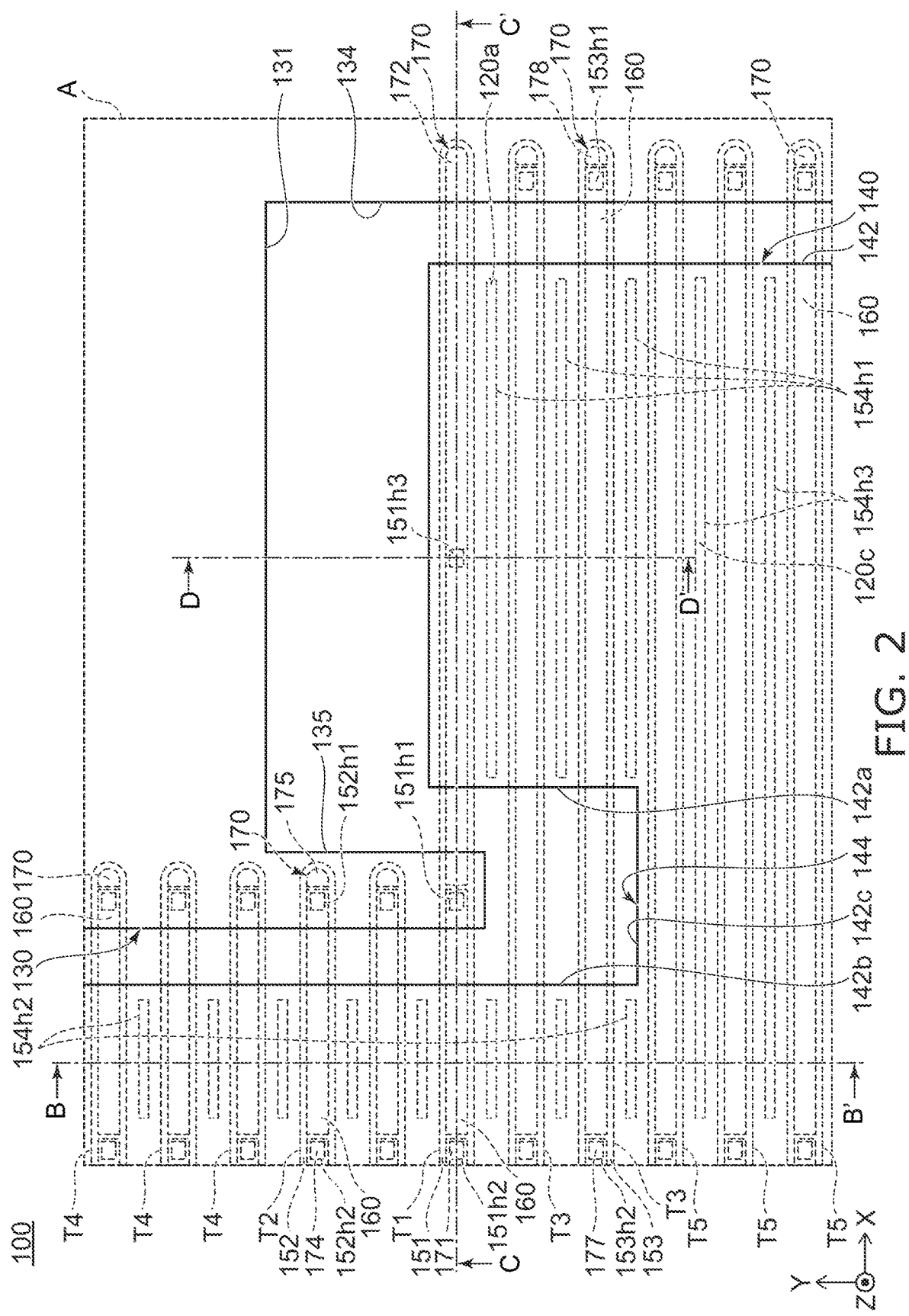
FIG. 2 is an enlarged top view of a portion of FIG. 1 surrounded with broken line A.

FIG. 2 is an enlarged top view of a portion of FIG. 1 surrounded with broken line A.

Figure 3:
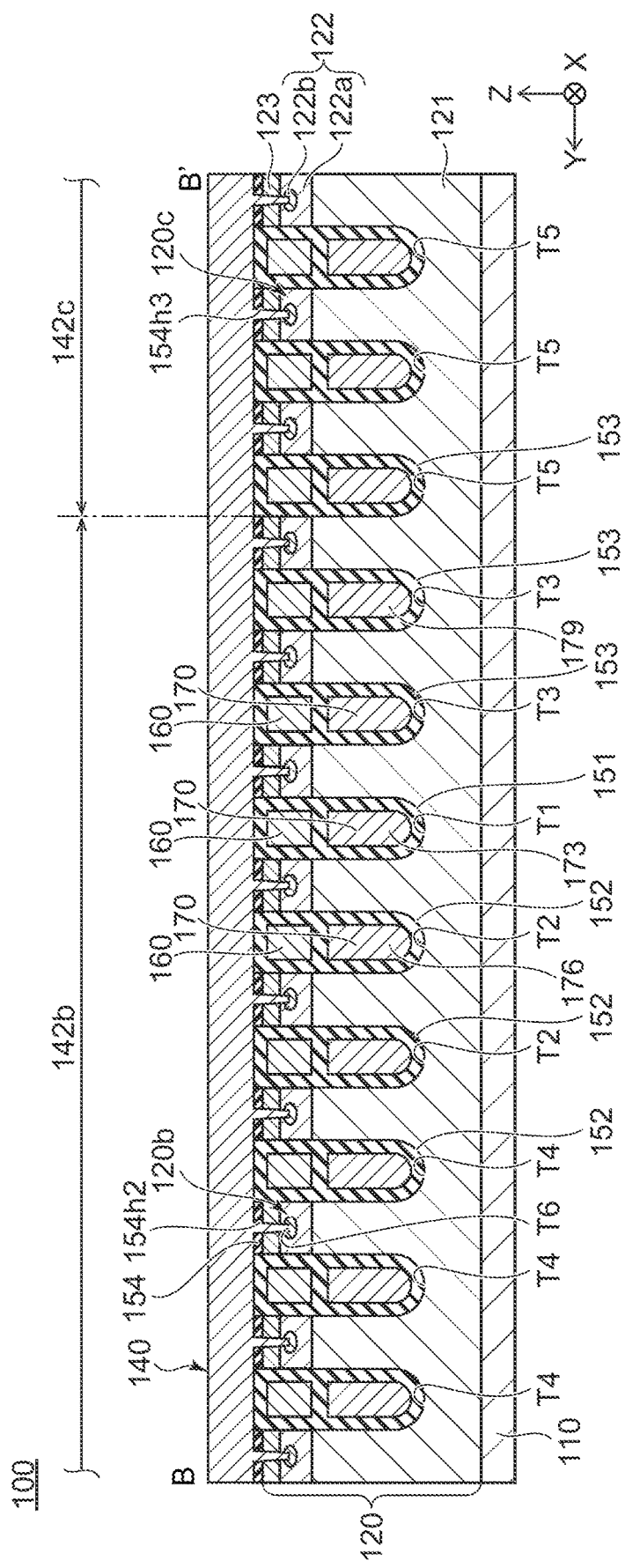
FIG. 3 is a cross-sectional view along line B-B' of FIG. 2.

FIG. 3 is a cross-sectional view along line B-B' of FIG. 2.

Figure 4:
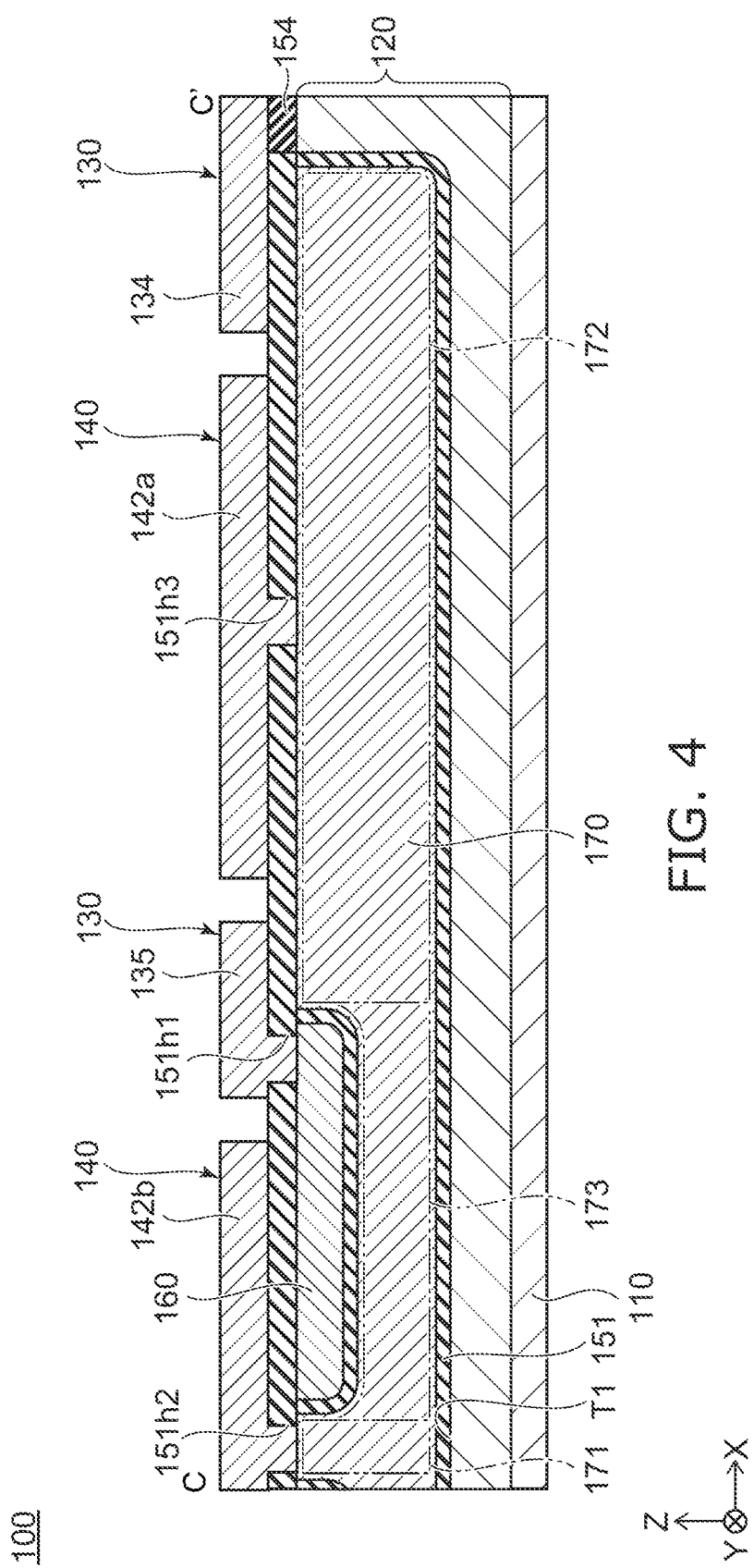
FIG. 4 is a cross-sectional view along line C-C' of FIG. 2.

FIG. 4 is a cross-sectional view along line C-C' of FIG. 2.

Figure 5:
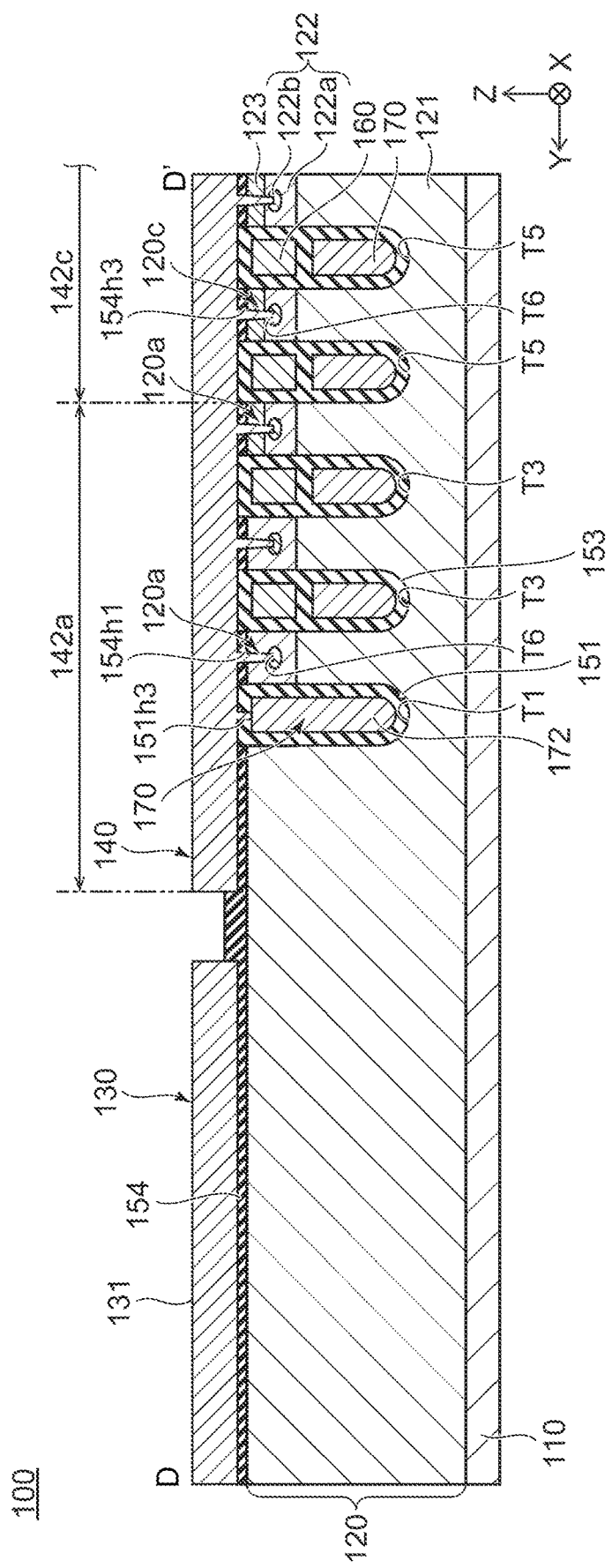
FIG. 5 is a cross-sectional view along line D-D' of FIG. 2.

FIG. 5 is a cross-sectional view along line D-D' of FIG. 2.

Figure 6:
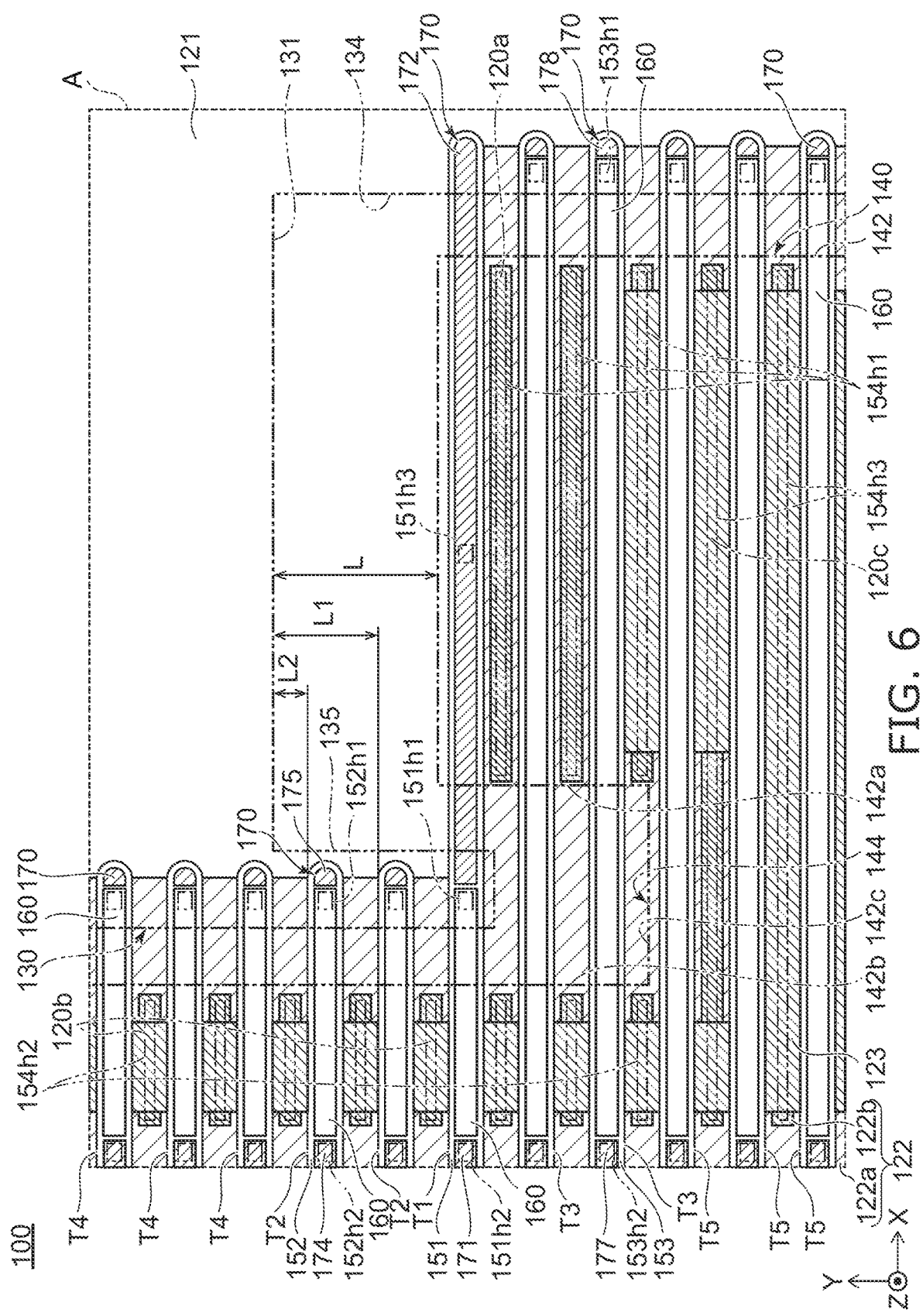
FIG. 6 is a schematic view showing a positional relationship of components of the semiconductor device according to the first embodiment when viewed from above.

FIG. 6 is a schematic view showing the positional relationship of the components of the semiconductor device according to the embodiment when viewed from above.

In FIG. 6, components that are actually not coplanar are shown as being coplanar to illustrate the positional relationship of the components of the semiconductor device 100 according to the embodiment when viewed from above. Also, for easier understanding of the areas in which a FP electrode 170, a p-type base region 122a, a p$^+$-type contact region 122b, and an n-type source layer 123 that are described below are located in FIG. 6, the areas in which the FP electrode 170, the p-type base region 122a, the p$^+$-type contact region 122b, and the n-type source layer 123 are located are shown by diagonal hatching.

The semiconductor device 100 according to the embodiment is, for example, a MOSFET. However, it is sufficient for the semiconductor device to include a gate electrode and a FP electrode; and the semiconductor device may be, for example, an IGBT (Insulated Gate Bipolar Transistor).

As shown in FIG. 1, the shape of the semiconductor device 100 when viewed from above is substantially a rectangle of which each side is substantially parallel to the X-direction or the Y-direction. However, the shape of the semiconductor device is not limited to that described above. Generally speaking, as shown in FIGS. 2 and 3, the semiconductor device 100 includes a drain electrode 110, a semiconductor part 120, an external gate electrode 130, and a source electrode 140. The semiconductor device 100 further includes an insulating film 151, multiple insulating films 152, multiple insulating films 153, and an insulating film 154. The semiconductor device further includes multiple internal gate electrodes 160 and multiple FP electrodes 170. The components of the semiconductor device 100 will now be described. Hereinbelow, the configuration of a pad portion 131 of the external gate electrode 130 shown in FIG. 1 and the vicinity of the pad portion 131 in the semiconductor device 100 is mainly described, and a description of the other structures is omitted as appropriate.

The drain electrode 110 is located in substantially the entire region of the lower surface of the semiconductor device 100. For example, as shown in FIG. 3, the upper surface and the lower surface of the drain electrode 110 are flat surfaces that are substantially parallel to the XY plane. The drain electrode 110 is made of a conductive material such as a metal material, etc. The semiconductor part 120 is located on the drain electrode 110.

The semiconductor part 120 includes, for example, an n-type semiconductor layer 121, a p-type semiconductor layer 122 that is located in the upper layer portion of the n-type semiconductor layer 121, and the n$^+$-type source layer 123 that is located in the upper layer portion of the p-type semiconductor layer 122. However, the configuration of the semiconductor part can be modified as appropriate according to the type of element.

The n-type semiconductor layer 121 includes an n$^-$-type drift region. The n$^-$-type drift region is located on substantially the entire region of the upper surface of the drain electrode 110. However, the n-type semiconductor layer may further include an n$^+$-type drain region that is located between the n$^-$-type drift region and the drain electrode and includes a higher impurity concentration than the n$^-$-type drift region.

The p-type semiconductor layer 122 includes the p-type base region 122a, and the p$^+$-type contact region 122b that is located in the p-type base region 122a. As shown in FIG. 5, the p-type base region 122a is partially provided in the upper layer portion of the n-type semiconductor layer 121. The p$^+$-type contact region 122b is partially provided in the p-type base region 122a and has an ohmic contact with the source electrode 140 that is described below. The details of the arrangement of the p-type base region 122a, the p$^+$-type contact region 122b, and the n$^+$-type source layer 123 are described below.

As shown in FIG. 1, the external gate electrode 130 and the source electrode 140 that is separated from the external gate electrode 130 are located above the semiconductor part 120.

The external gate electrode 130 has a so-called finger configuration. The external gate electrode 130 includes, for example, the pad portion 131, a first extension portion 132, multiple second extension portions 133, a third extension portion 134, and a protrusion 135.

The pad portion 131 is a portion to which a wiring member (not illustrated) is connected to electrically connect the external gate electrode 130 to an external circuit of the semiconductor device 100. According to the embodiment, the pad portion 131 is located at the corner among the four corners of the semiconductor part 120 that is positioned furthest toward the +X side and the +Y side. According to the embodiment, the pad portion 131 is substantially rectangular when viewed from above.

The first extension portion 132 extends in the −X direction from the corner of the pad portion 131 that is positioned furthest toward the −X side and the +Y side. The first extension portion 132 is positioned on the +Y direction end portion of the semiconductor part 120. The second extension portions 133 extend in the −Y direction from the first extension portion 132. The multiple second extension portions 133 are arranged in the X-direction. The third extension portion 134 extends in the −Y direction from the corner of the pad portion 131 that is positioned furthest toward the +X side and the −Y side. The −Y direction end portions of each of the second and third extension portions 133 and 134 extend to the vicinity of the −Y direction end portion of the semiconductor part 120.

The protrusion 135 protrudes in the −Y direction from the −X direction end portion of the pad portion 131, and specifically, the corner positioned furthest toward the −X side and the −Y side. The shape of the protrusion 135 when viewed in top-view is, for example, substantially rectangular. The length of the protrusion 135 in the Y-direction is less than the lengths of the second and third extension portions 133 and 134 in the Y-direction.

The external gate electrode 130 is made of a conductive material such as a metal material, etc. The external gate electrode 130 may include a stacked body of two or more metal layers.

As shown in FIG. 1, the source electrode 140 also has a so-called finger configuration. The source electrode 140 includes, for example, multiple first extension portions 141, a second extension portion 142, and multiple third extension portions 143.

The first extension portions 141 and the second extension portion 142 extend in the +Y direction from the −Y direction end portion of the semiconductor part 120. Each first extension portion 141 is positioned between two second extension portions 133 of the external gate electrode 130 that are next to each other. The second extension portion 142 is positioned between the second extension portion 133 and the third extension portion 134 that are next to each other. Each third extension portion 143 is positioned between the −Y direction end portions of two second extension portions 142 that are next to each other or between the −Y direction end portion of the second extension portion 142 and the −Y direction end portion of the third extension portion 143 that are next to each other; and the third extension portions 143 link these portions to each other.

The second extension portion 142 includes a first covering portion 142a, a second covering portion 142b, and a third covering portion 142c. The third covering portion 142c extends in the +Y direction from the −Y direction end portion of the semiconductor part 120. The first covering portion 142a and the second covering portion 142b protrude in the +Y direction from the third covering portion 142c. The first covering portion 142a is positioned at the −Y side of the pad portion 131 and the +X side of the protrusion 135. The second covering portion 142b is positioned at the −X side of the pad portion 131 and the protrusion 135. The protrusion 135 is positioned between the first covering portion 142a and the second covering portion 142b in the X-direction. The shapes of the first covering portion 142a, the second covering portion 142b, and the third covering portion 142c when viewed from above are, for example, rectangular. A recess 144 is formed from the first covering portion 142a, the second covering portion 142b, and the third covering portion 142c. The protrusion 135 is located in the recess 144. Here, "the protrusion is located in the recess" means that at least a portion of the protrusion is positioned in the recess.

The source electrode 140 is made of a conductive material such as a metal material, etc. The source electrode 140 may include a stacked body of two or more metal layers.

As shown in FIGS. 2 and 3, a trench T1, two trenches T2, two trenches T3, multiple trenches T4, and multiple trenches T5 are provided in the semiconductor part 120. The trenches T1 to T5 extend in the X-direction and are so-called straight-type trenches without branches. The trenches T1 to T5 extend downward from the upper surface of the semiconductor part 120. The number of the trenches T2 and the number of the trenches T3 are not limited to two and may be one, three, or more.

As shown in FIG. 6, a portion of the trench T1 is covered with the second covering portion 142b, the protrusion 135, and the first covering portion 142a when viewed from above. The +X direction end portion of the trench T1 is covered with the third extension portion 134 when viewed from above.

The insulating film 151 is located in the trench T1. The insulating film 151 is made of an insulating material such as silicon oxide, silicon nitride, etc. The multiple internal gate electrodes 160 and the FP electrode 170 are located in the insulating film 151. The internal gate electrode 160 that is positioned furthest toward the +X side among the multiple internal gate electrodes 160 in the trench T1 will now be described.

As shown in FIGS. 4 and 6, the internal gate electrode 160 that is in the trench T1 extends in the X-direction. When viewed from above, the −X direction end portion of the internal gate electrode 160 is covered with the second covering portion 142b; and the +X direction end portion of the internal gate electrode 160 is covered with the protrusion 135. An opening 151h1 is provided in the portion of the insulating film 151 positioned between the internal gate electrode 160 and the protrusion 135. The protrusion 135 is connected to the internal gate electrode 160 via the opening 151h1. Thereby, the external gate electrode 130 is connected to the internal gate electrode 160 via a current path that extends in the Z-direction.

As shown in FIGS. 4 and 6, the FP electrode 170 that is in the trench T1 extends in the X-direction. The FP electrode 170 includes a first portion 171, a second portion 172, and a first middle portion 173 positioned between the first portion 171 and the second portion 172, such that the internal gate electrode 160 is positioned between the first portion 171 and the second portion 172 in the X-direction, and the first middle portion 173 is positioned below the internal gate electrode 160. The first portion 171 is positioned at the −X side of the internal gate electrode 160. In other words, the first portion 171 is next to the −X direction end portion of the internal gate electrode 160 in the X-direction. The second portion 172 is positioned at the +X side of the internal gate electrode 160, and according to the embodiment, includes the +X direction end portion of the FP electrode 170. In other words, the second portion 172 is next to the +X direction end portion of the internal gate electrode 160 in the X-direction. The insulating film 151 is located between the FP electrode 170 and the internal gate electrode 160.

Thus, at the vicinity of the pad portion 131, the FP electrode 170 separates the internal gate electrode 160 from the other internal gate electrode 160 (not illustrated) that is positioned further toward the −X side than the first portion 171 of the FP electrode 170. According to the embodiment, the internal gate electrode 160 thus separated is connected to the protrusion 135. Therefore, the internal gate electrode 160 thus separated can be electrically connected to the external gate electrode 130.

The first portion 171 is covered with the second covering portion 142b. An opening 151h2 is provided in the portion of the insulating film 151 positioned between the first portion 171 and the second covering portion 142b. The second covering portion 142b is connected to the first portion 171 via the opening 151h2.

The −X direction end portion of the second portion 172 is covered with the protrusion 135; and the remaining portion of the second portion 172 is not covered with the protrusion 135 when viewed from above. The +X direction end portion of the second portion 172 is covered with the third extension portion 134. The portion of the second portion 172 positioned between the two X-direction end portions is covered with the first covering portion 142a. An opening 151h3 is provided in the portion of the insulating film 151 positioned between the second portion 172 and the first covering portion 142a. The first covering portion 142a is connected to the second portion 172 via the opening 151h3. Thereby, the potential of the second portion 172 extending from the protrusion 135 to the third extension portion 134 when viewed from above easily has the same potential as the source electrode 140. However, because the FP electrode 170 is electrically connected to the source electrode 140 via the first portion 171, the first covering portion 142a may not be connected to the second portion 172 via the opening 151h3 of the insulating film 151.

The two trenches T2 are positioned at the +Y side of the trench T1 and are arranged in the Y-direction. When viewed from above, a portion of each trench T2 is covered with the second covering portion 142b; and the +X direction end portion of each trench T2 is covered with the protrusion 135. The trenches T2 are not covered with the first covering portion 142a.

The insulating film 152 is located in each trench T2. The insulating films 152 are made of an insulating material such as silicon oxide, silicon nitride, etc. The multiple internal gate electrodes 160 and the FP electrode 170 are located in each insulating film 152. The internal gate electrode 160 that is positioned furthest toward the +X side among the multiple internal gate electrodes 160 in each trench T2 will now be described.

The internal gate electrode 160 that is in each trench T2 extends in the X-direction. When viewed from above, the −X direction end portion of this internal gate electrode 160 is covered with the second covering portion 142b; and the +X direction end portion of this internal gate electrode 160 is covered with the protrusion 135. An opening 152h1 is provided in the portion of the insulating film 152 positioned between this internal gate electrode 160 and the protrusion 135. The protrusion 135 is connected to this internal gate electrode 160 via the opening 152h1.

The FP electrode 170 that is in each trench T2 extends in the X-direction. As shown in FIGS. 3 and 6, the FP electrode 170 includes a third portion 174, a fourth portion 175, and a second middle portion 176 positioned between the third portion 174 and the fourth portion 175, such that the internal gate electrode 160 is positioned between the third portion 174 and the fourth portion 175 in the X-direction, and the second middle portion 176 is positioned below the internal gate electrode 160. The third portion 174 is positioned at the −X side of the internal gate electrode 160. In other words, the third portion 174 is next to the −X direction end portion of the internal gate electrode 160 in the X-direction. The third portion 174 is next to the first portion 171 in the Y-direction. The fourth portion 175 is positioned at the +X side of the internal gate electrode 160, and according to the embodiment, corresponds to the +X direction end portion of the FP electrode 170. In other words, the fourth portion 175 is next to the +X direction end portion of the internal gate electrode 160 in the X-direction. The insulating film 152 is located between the internal gate electrode 160 and the FP electrode 170.

Thus, at the vicinity of the pad portion 131, the FP electrode 170 separates the internal gate electrode 160 from the other internal gate electrode 160 (not illustrated) that is positioned further toward the −X side than the third portion 174 of the FP electrode 170. According to the embodiment, the internal gate electrode 160 thus separated is connected to the protrusion 135. Therefore, the internal gate electrode 160 thus separated can be electrically connected to the external gate electrode 130.

The third portion 174 is covered with the second covering portion 142b. An opening 152h2 is provided in the portion of the insulating film 152 positioned between the third portion 174 and the second covering portion 142b. The second covering portion 142b is connected to the third portion 174 via the opening 152h2. The fourth portion 175 is covered with the protrusion 135. The length in the X-direction of the fourth portion 175 is less than the length in the X-direction of the second portion 172.

Thus, in the +Y direction, the pad portion 131 is separated from the +X direction end portion of the internal gate electrode 160 in each trench T2. A distance L between the first covering portion 142a and the pad portion 131 in the Y-direction is greater than distances L1 and L2 between the pad portion 131 and the trenches T2 in the Y-direction. In other words, the positions of the trenches T2 in the Y-direction are between the position of the pad portion 131 in the Y-direction and the position of the first covering portion 142a in the Y-direction. The protrusion 135 protrudes from the pad portion 131, covers the +X direction end portion of the internal gate electrode 160 in each trench T2, and is connected to the +X direction end portion of the internal gate electrode 160 in each trench T2.

The two trenches T3 are positioned at the −Y side of the trench T1 in the Y-direction. When viewed from above, a portion of each trench T3 is covered with the first and second covering portions 142a and 142b and not covered with the protrusion 135. The +X direction end portion of each trench T3 is covered with the third extension portion 134 when viewed from above.

The insulating film 153 is located in each trench T3. The insulating films 153 are made of an insulating material such as silicon oxide, silicon nitride, etc. The multiple internal gate electrodes 160 and the FP electrode 170 are located in each insulating film 153. The internal gate electrode 160 that is positioned furthest toward the +X side among the multiple internal gate electrodes 160 in each trench T3 will now be described.

The internal gate electrode 160 that is in each trench T3 extends in the X-direction. When viewed from above, the −X direction end portion of this internal gate electrode 160 is covered with the second covering portion 142b; and the +X direction end portion of this internal gate electrode 160 is covered with the third extension portion 134. The first covering portion 142a covers between the two X-direction end portions of this internal gate electrode 160. An opening 153h1 is provided in the portion of the insulating film 153 positioned between this internal gate electrode 160 and the third extension portion 134. The third extension portion 134 is connected to this internal gate electrode 160 via the opening 153h1.

The FP electrode 170 that is in each trench T3 extends in the X-direction. As shown in FIGS. 3 and 6, the FP electrode 170 includes a fifth portion 177, a sixth portion 178, and a third middle portion 179 between the fifth portion 177 and the sixth portion 178, such that the internal gate electrode 160 is positioned between the fifth portion 177 and the sixth portion 178 in the X-direction, and the third middle portion 179 is positioned below the internal gate electrode 160. The fifth portion 177 is positioned at the −X side of the internal gate electrode 160. In other words, the fifth portion 177 is next to the −X direction end portion of the internal gate electrode 160 in the X-direction. The fifth portion 177 is next to the first portion 171 in the Y-direction. The sixth portion 178 is positioned at the +X side of the internal gate electrode 160, and according to the embodiment, corresponds to the +X direction end portion of the FP electrode 170. In other words, the sixth portion 178 is next to the +X direction end portion of the internal gate electrode 160 in the X-direction. The insulating film 153 is located between the internal gate electrode 160 and the FP electrode 170.

Thus, at the vicinity of the pad portion 131, the FP electrode 170 separates the internal gate electrode 160 from the other internal gate electrode 160 (not illustrated) that is positioned further toward the −X side than the fifth portion 177 of the FP electrode 170. According to the embodiment, the internal gate electrode 160 thus separated is connected to the third extension portion 134. Therefore, the internal gate electrode 160 thus separated can be electrically connected to the external gate electrode 130.

The fifth portion 177 is covered with the second covering portion 142b. An opening 153h2 is provided in the portion of the insulating film 153 positioned between the fifth portion 177 and the second covering portion 142b. The second covering portion 142b is connected to the fifth portion 177 via the opening 153h2. The sixth portion 178 is covered with the third extension portion 134. The length in the X-direction of the sixth portion 178 is less than the length in the X-direction of the second portion 172.

The multiple trenches T4 are located at the +Y side of the multiple trenches T2 and are arranged in the Y-direction. Other than the X-direction end portion being covered with the pad portion 131 instead of the protrusion 135 when viewed from above, the configuration and the internal configuration of each trench T4 are substantially similar to those of the trench T2; and a description is therefore omitted.

The multiple trenches T5 are located at the +Y side of the multiple trenches T3 and are arranged in the Y-direction. Other than being covered with the third covering portion 142c and not with the first and second covering portions 142a and 142b when viewed from above, the configuration and the internal configuration of each trench T5 are substantially similar to those of the trench T3; and a description is therefore omitted.

As shown in FIG. 5, the insulating film 154 is located between the external gate electrode 130 and the upper surface of the semiconductor part 120 and between the source electrode 140 and the upper surface of the semiconductor part 120.

As shown in FIG. 6, three openings 154h1, multiple openings 154h2, and multiple openings 154h3 are provided in the insulating film 154.

Each opening 154h1 is positioned between the first covering portion 142a of the source electrode 140 and a contact portion 120a positioned between the trenches T1, T3, and T5 that are next to each other in the semiconductor part 120. The openings 154h1 extend in the X-direction and are covered with the first covering portion 142a when viewed from above. As shown in FIG. 5, the first covering portion 142a is connected to the contact portions 120a via the openings 154h1. According to the embodiment, the contact portion 120a is the surface of a trench T6 that extends downward from the upper surface of the semiconductor part 120. This is similar for the other contact portions 120b and 120c that are described below as well. However, a portion of the upper surface of the semiconductor part may be used as a contact portion without providing such a trench in the semiconductor part.

According to the embodiment, the p-type base region 122a and the p$^+$-type contact region 122b are included but the n-type source layer 123 is not included in the contact portion 120a between the trench T1 and the trench T3 that are next to each other and in the contact portion 120a between the trenches T3 that are next to each other. However, the n-type source layer 123 also may be included in the contact portion 120a. Also, according to the embodiment, the p-type base region 122a, the p$^+$-type contact region 122b, and the n-type source layer 123 are included in the contact portion 120a between the trench T3 and the trench T5 that are next to each other.

As shown in FIG. 6, each opening 154h2 is positioned between the second covering portion 142b of the source electrode 140 and the contact portion 120b positioned between the trenches T1, T2, and T4 that are next to each other in the semiconductor part 120. The openings 154h2 extend in the X-direction. As shown in FIG. 3, the second covering portion 142b is connected to the contact portions 120b via the openings 154h2. According to the embodiment, the p-type base region 122a, the p$^+$-type contact region 122b, and the n-type source layer 123 are included in each contact portion 120b.

As shown in FIG. 6, each opening 154h3 is positioned between the third covering portion 142c and the contact portion 120c positioned between the trenches T5 that are next to each other in the semiconductor part 120. The openings 154h3 extend in the X-direction. As shown in FIG. 3, the third covering portion 142c is connected to the contact portions 120c via the openings 154h3. According to the embodiment, the p-type base region 122a, the p$^+$-type contact region 122b, and the n-type source layer 123 are included in each contact portion 120c.

Effects of the embodiment will now be described.

Figure 7:
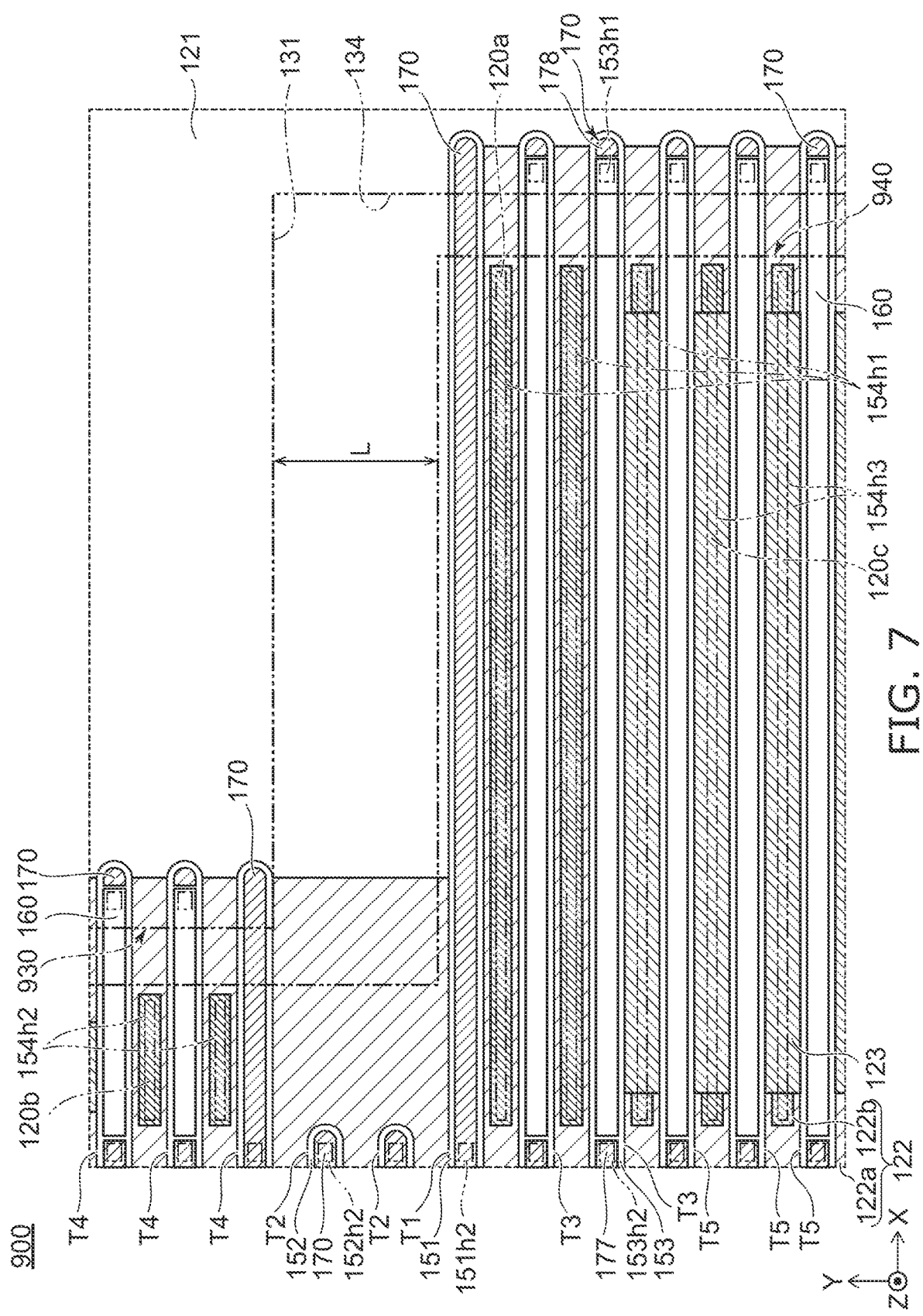
FIG. 7 is an enlarged schematic view showing the positional relationship of components of a semiconductor device according to a reference example when viewed from above.

FIG. 7 is an enlarged schematic view showing the positional relationship of components of a semiconductor device according to a reference example when viewed from above.

In the semiconductor device 900 according to the reference example, the protrusion 135 that protrudes in the −Y direction from the pad portion 131 is not included in an external gate electrode 930. Also, in the semiconductor device 900 according to the reference example, the recess 144 in which the protrusion 135 is located is not provided in a source electrode 940.

It is necessary to separate the external gate electrode 930 and the source electrode 940 by the distance L of some length in the Y-direction. An example is described hereinbelow in which the distance L is the length between two trenches arranged in the Y-direction.

The vicinity of the pad portion 131 is the termination region of the semiconductor device 900. Therefore, from the perspective of increasing the breakdown voltage, it is favorable for the FP electrode 170 to extend to the +X direction end portion of each of the trenches T1 to T6, and for the internal gate electrode 160 not to be provided in the end portion of each of the trenches T1 to T6. Thus, when the FP electrode 170 extends to the +X direction end portion of each of the trenches T1 to T6, even if the internal gate electrode 160 is located at the vicinity of the pad portion 131 in each of the trenches T1 to T6, the FP electrode 170 separates this internal gate electrode 160 from the internal gate electrode 160 at the center of the semiconductor part 120. Accordingly, in the semiconductor device 900 according to the reference example, it is necessary to connect such an internal gate electrode 160 to the pad portion 131 or the third extension portion 134.

However, in the semiconductor device 900 according to the reference example, even if the two trenches T2 extend to be directly under the third extension portion 134, the internal gate electrodes 160 are provided inside the two trenches T2, and the third extension portion 134 is connected to these internal gate electrodes 160, the source electrode 940 cannot be connected to the portion of the semiconductor part 120 positioned between the pad portion 131 and the source electrode 940 in the Y-direction. Therefore, there is a possibility that the gate capacity and the avalanche resistance may decrease. Accordingly, in the semiconductor device 900 according to the reference example, it is favorable to provide the FP electrodes 170 in the +X direction end portions of the two trenches T2 and cover the FP electrodes 170 with the source electrode 140 without the two trenches T2 extending to the third extension portion 134 so that the gate capacity and/or the avalanche resistance does not decrease.

In such a case, the trench T1 and the portion of the trench T4 that is positioned furthest toward the −Y side and is not positioned between two other trenches are end point regions; therefore, it is favorable to provide the FP electrode 170 from the perspective of increasing the breakdown voltage. Accordingly, in the semiconductor device 900 according to the reference example, the region between the trench T1 and the trench T4 positioned furthest toward the −Y side is ineffective as an element such as a MOSFET, etc.

Conversely, in the semiconductor device 100 according to the embodiment, the external gate electrode 130 includes the protrusion 135 that protrudes from the pad portion 131, covers the internal gate electrode 160 in the trench T1, and is connected to the internal gate electrode 160. The source electrode 140 includes the first covering portion 142a that covers the contact portion 120a of the semiconductor part 120 adjacent to the second portion 172 of the FP electrode in the trench T1 when viewed from above and is connected to the contact portion 120a, and includes the second covering portion 142b that covers the first portion 171 and is connected to the contact portion 120a. Therefore, the internal gate electrode 160 can be located in the trench T1 and connected to the external gate electrode 130 at the vicinity of the pad portion 131 while maintaining the state in which the FP electrode in the trench T1 and the contact portion 120a of the semiconductor part 120 are connected to the source electrode 140. Therefore, the effective element area can be increased.

The first covering portion 142a also covers the second portion 172 of the FP electrode 170 in the trench T1 and is connected to the second portion 172. Therefore, the potential of the second portion 172 can easily be the same potential as the potential of the source electrode 140.

The internal gate electrode 160 that is in each trench T2 positioned in the Y-direction between the position of the pad portion 131 in the Y-direction and the position of the first covering portion 142a in the Y-direction cannot be directly connected to the pad portion 131. Conversely, the protrusion 135 covers the internal gate electrode 160 in the trench T2 when viewed from above and is connected to the internal gate electrode 160. Therefore, the effective element area can be increased.

The second covering portion 142b covers the contact portion 120b of the semiconductor part 120 positioned between the internal gate electrode 160 in the trench T1 and the internal gate electrode 160 in the trench T2 when viewed from above, and is connected to the contact portion 120b. Therefore, the effective element area can be increased.

The n-type source layer 123 is included in the contact portion 120b. Therefore, the surface area in which the n-type source layer 123 is located can be increased.

The n-type source layer 123 also is located under the first covering portion 142a; and the first covering portion 142a is connected to the n-type source layer 123. Therefore, the surface area in which the n-type source layer 123 is located can be increased.

Second Embodiment

A embodiment will now be described.

Figure 8:
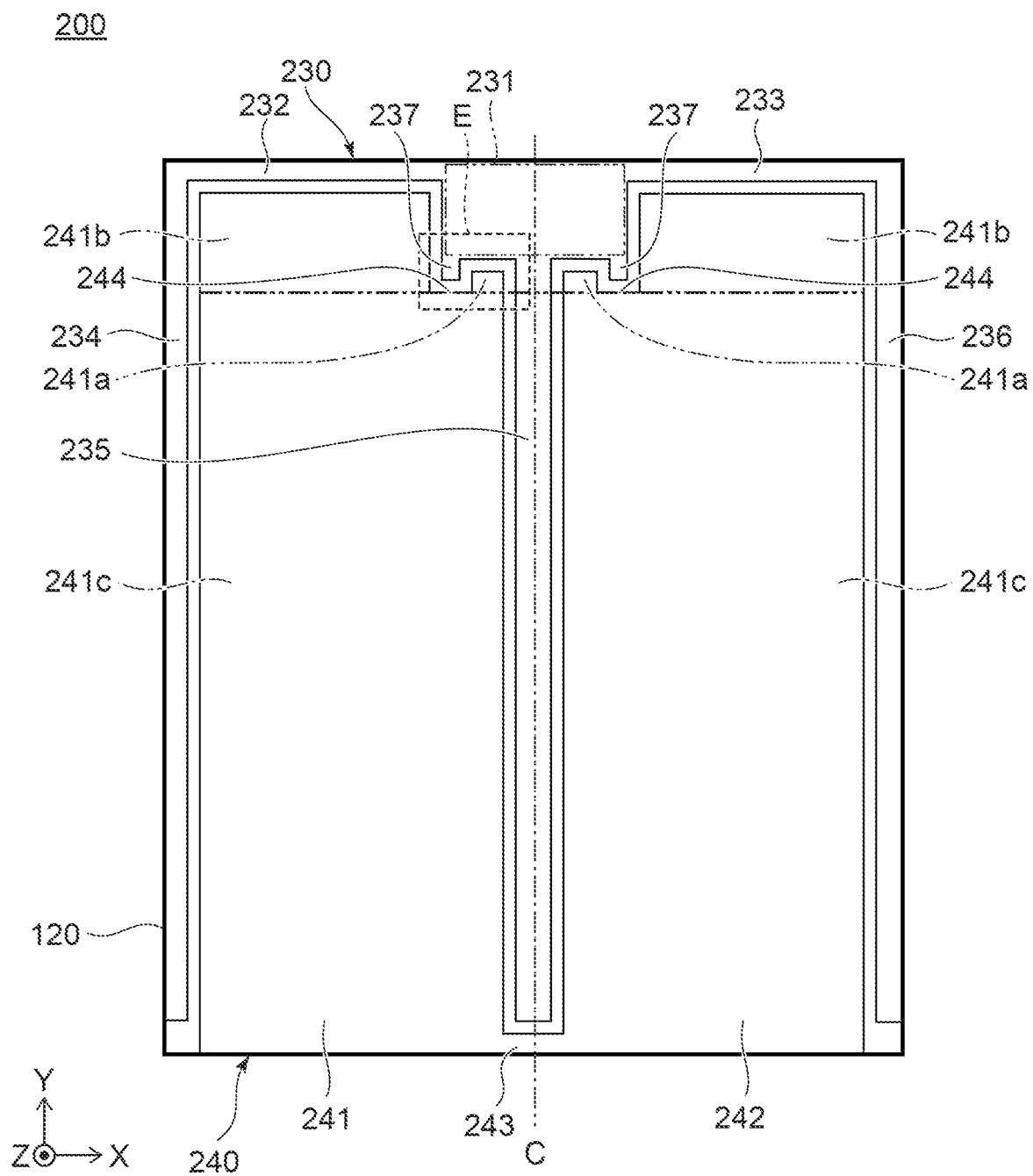
FIG. 8 is a top view showing a semiconductor device according to a second embodiment.

FIG. 8 is a top view showing a semiconductor device according to the embodiment.

Figure 9:
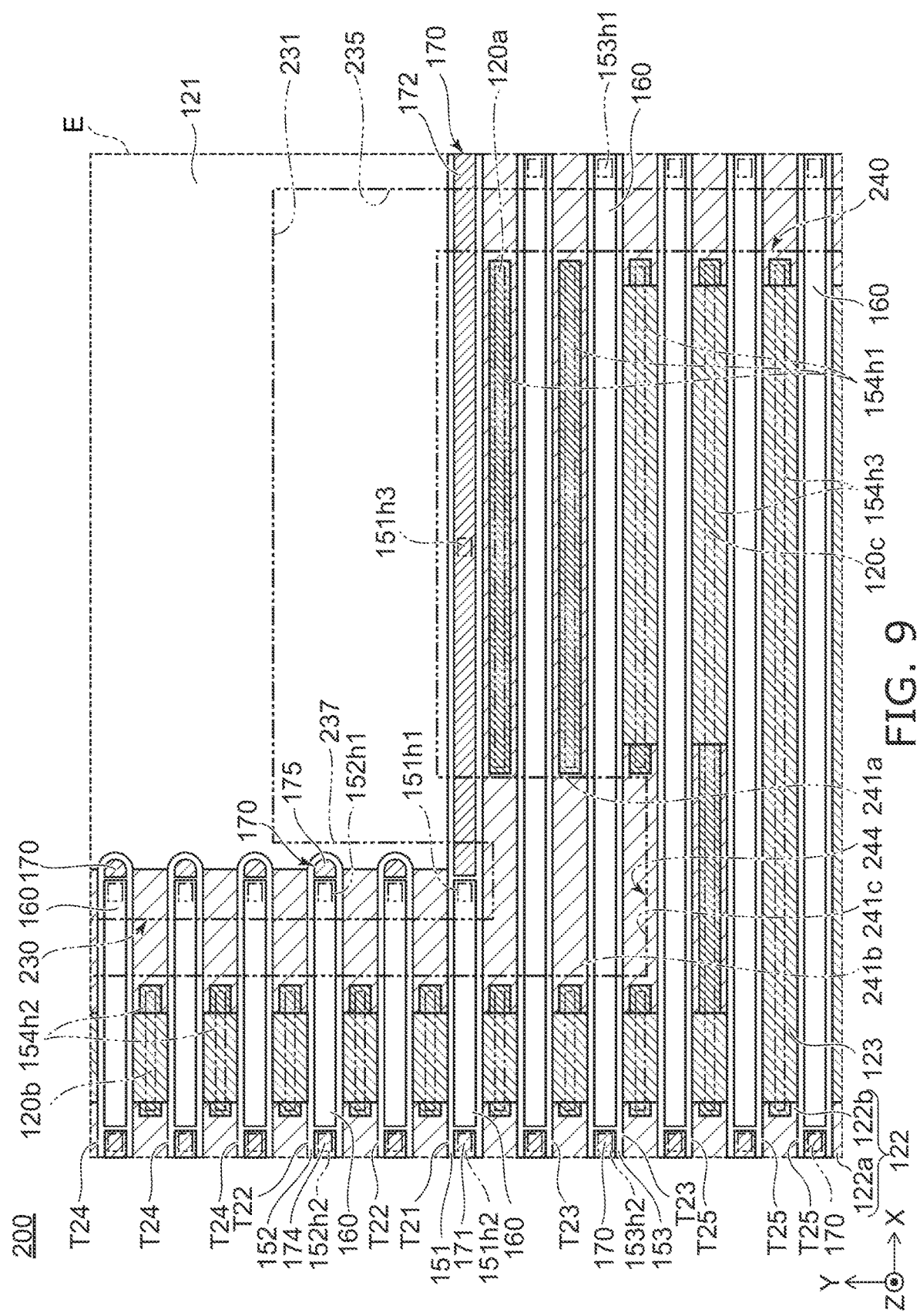
FIG. 9 is a schematic view showing a positional relationship of components when viewed from above in the portion surrounded with broken line E of FIG. 8.

FIG. 9 is a schematic view showing the positional relationship of components when viewed from above in the portion surrounded with broken line E of FIG. 8.

The semiconductor device 200 according to the embodiment differs from the semiconductor device 100 according to the first embodiment in that a pad portion 231 is positioned at substantially the X-direction center of the semiconductor part 120.

As a general rule in the following description, only the differences with the first embodiment are described. Other than the items described below, the embodiment is similar to the first embodiment.

An external gate electrode 230 includes the pad portion 231, a first extension portion 232, a second extension portion 233, a third extension portion 234, a fourth extension portion 235, a fifth extension portion 236, and two protrusions 237.

The pad portion 231 is positioned at substantially the X-direction center at the +Y direction end portion of the semiconductor part 120. The shape of the pad portion 231 when viewed from above is substantially rectangular. Thus, the position of the pad portion is not limited to a corner of the semiconductor part.

The first extension portion 232 extends in the −X direction from the corner of the pad portion 231 positioned furthest toward the −X side and the +Y side. The second extension portion 233 extends in the +X direction from the corner of the pad portion 231 positioned furthest toward the +X side and the +Y side. The third extension portion 234 extends in the −Y direction from the −X direction end portion of the first extension portion 232. The fourth extension portion 235 extends in the −Y direction from substantially the X-direction center at the +Y direction end portion of the pad portion 231. The fifth extension portion 236 extends in the −Y direction from the +X direction end portion of the second extension portion 233.

One protrusion 237 protrudes in the −Y direction from the −X direction end portion of the pad portion 231, and specifically, the corner positioned furthest toward the −X side and the −Y side. Another protrusion 237 protrudes in the −Y direction from the +X direction end portion of the pad portion 231, and specifically, the end portion positioned furthest toward the +X side and the −Y side.

A source electrode 240 includes a first extension portion 241, a second extension portion 242, and a third extension portion 243.

The first extension portion 241 extends in the +Y direction from the −Y direction end portion of the semiconductor part 120 and is positioned between the third extension portion 234 and the fourth extension portion 235 of the external gate electrode 230. The second extension portion 242 extends in the +Y direction from the −Y direction end portion of the semiconductor part 120 and is positioned between the fourth extension portion 235 and the fifth extension portion 236 of the external gate electrode 230. The third extension portion 243 is positioned between the −Y direction end portion of the first extension portion 241 and the −Y direction end portion of the second extension portion 242 and is linked to these end portions.

The first extension portion 241 includes a first covering portion 241a, a second covering portion 241b, and a third covering portion 241c. The third covering portion 241c extends in the +Y direction from the −Y direction end portion of the semiconductor part 120. The first covering portion 241a and the second covering portion 241b protrude in the +Y direction from the third covering portion 241c. The first covering portion 241a is positioned at the −Y side of the pad portion 231 and the +X side of the protrusion 237. The second covering portion 241b is positioned at the −X side of the pad portion 231 and the protrusion 237. One protrusion 237 is positioned between the first covering portion 241a and the second covering portion 241b in the X-direction. A recess 244 is formed from the first covering portion 241a, the second covering portion 241b, and the third covering portion 241c. The protrusion 237 is located in the recess 244.

The shape of the second extension portion 242 is substantially symmetric with the first extension portion 241 with respect to a central axis C of the semiconductor device 200 extending in the Y-direction; and a description is therefore omitted.

The structure of the vicinity of the pad portion 231 at the −X side of the central axis C will now be described. The structure of the vicinity of the pad portion 231 at the +X side of the central axis C is symmetric with the structure of the vicinity of the pad portion 231 at the −X side of the central axis C when referenced to the central axis C; and a description is therefore omitted.

A trench T21, two trenches T22, two trenches T23, multiple trenches T24, and multiple trenches T25 are provided in the semiconductor part 120. Other than a middle portion instead of the +X direction end portion of the trench T21 being covered with the fourth extension portion 235, the structure and the internal structure of the trench T21 are similar to those of the trench T1 according to the first embodiment; and a description is therefore omitted. The structure and the internal structure of the trench T22 are similar to those of the trench T2 according to the first embodiment; and a description is therefore omitted. Other than a middle portion instead of the +X direction end portion of the trench T23 being covered with the fourth extension portion 235, and the FP electrode 170 being located below the internal gate electrode 160 in the portion of the trench T23 positioned directly under the fourth extension portion 235, the structure and the internal structure of the trench T23 are similar to those of the trench T3 according to the first embodiment; and a description is therefore omitted. The structure and the internal structure of the trench T24 are similar to those of the trench T4 according to the first embodiment; and a description is therefore omitted. Other than a middle portion instead of the +X direction end portion of the trench T25 being covered with the fourth extension portion 235, and the FP electrode 170 being located below the internal gate electrode 160 in the portion of the trench T25 positioned directly under the fourth extension portion 235, the structure and the internal structure of the trench T25 are similar to those of the trench T5 according to the first embodiment; and a description is therefore omitted.

The protrusion 237 covers the internal gate electrode 160 in the trench T21 and the internal gate electrode 160 in the trench T22 when viewed from above and is connected to these internal gate electrodes via the openings 151*h*1 and 152*h*1. The fourth extension portion 235 covers the internal gate electrodes 160 in the trenches T23 and T25 and is connected to these internal gate electrodes via the openings 153*h*1.

The first covering portion 241*a* covers the second portion 172 of the FP electrode 170 in the trench T21 when viewed from above and is connected to the second portion via the opening 151*h*3. The first covering portion 241*a* covers the contact portions 120*a* between the trenches T21 and T23 that are next to each other in the semiconductor part 120, and is connected to these contact portions via the openings 154*h*1.

When viewed from above, the second covering portion 241*b* covers the first portion 171 of the FP electrode 170 in the trench T21, the third portions 174 of the FP electrodes 170 in the trenches T22 and T24, and the FP electrodes 170 in the trenches T23 and T25, and is connected to these FP electrodes via the openings 151*h*2, 152*h*2, and 153*h*2. When viewed from above, the second covering portion 241*b* covers the contact portions 120*b* between the trenches T21, T22, and T24 that are next to each other in the semiconductor part 120, and is connected to these contact portions via the openings 154*h*2.

The third covering portion 241*c* covers the FP electrodes 170 in the trenches T25 when viewed from above and is connected to these FP electrodes via the openings 153*h*2. When viewed from above, the third covering portion 241*c* covers the contact portions 120*c* between the trenches T23 and T25 that are next to each other in the semiconductor part 120, and is connected to these contact portions via the openings 154*h*3.

Effects of the embodiment will now be described.

In the semiconductor device 200 according to the embodiment as well, the external gate electrode 230 includes the protrusion 237 that protrudes from the pad portion 231, covers the internal gate electrode 160 in the trench T21, and is connected to the internal gate electrode 160. The source electrode 240 includes the first covering portion 241*a* that covers the contact portion 120*a* of the semiconductor part 120 adjacent to the second portion 172 of the FP electrode in the trench T21 when viewed from above and is connected to the second portion 172, and includes the second covering portion 241*b* that covers the first portion 171 and is connected to the first portion 171. Therefore, the internal gate electrode 160 can be connected to the external gate electrode 230 in the trench T21 while maintaining the state in which the FP electrode 170 in the trench T21 and the contact portion 120*a* of the semiconductor part 120 are connected to the source electrode 240. Therefore, the effective element area can be increased.

Third Embodiment

A third embodiment will now be described.

Figure 10:
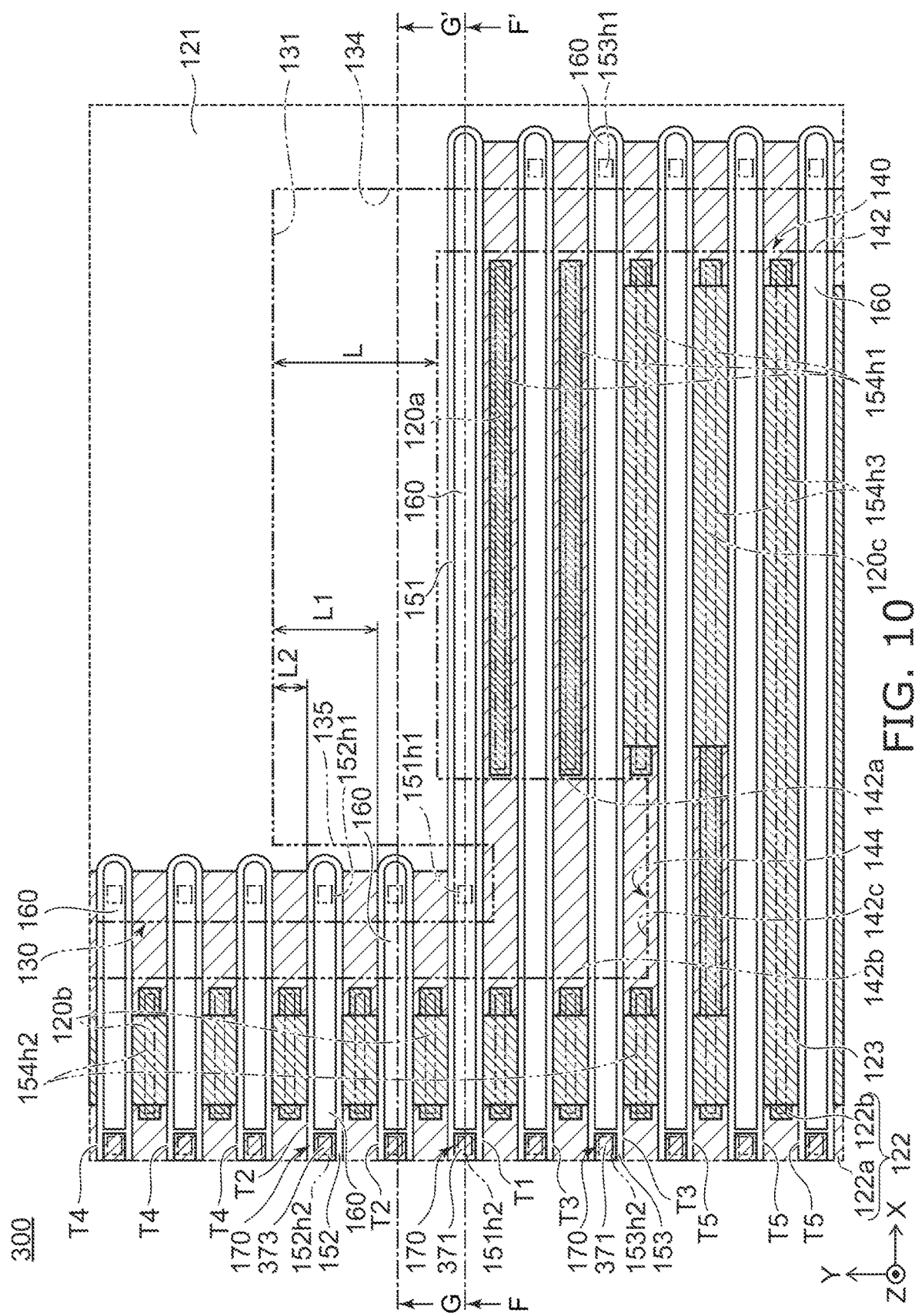
FIG. 10 is a schematic view showing a positional relationship of components of a semiconductor device according to a third embodiment when viewed from above.

FIG. 10 is a schematic view showing the positional relationship of components of the semiconductor device according to the embodiment when viewed from above.

Figure 11:
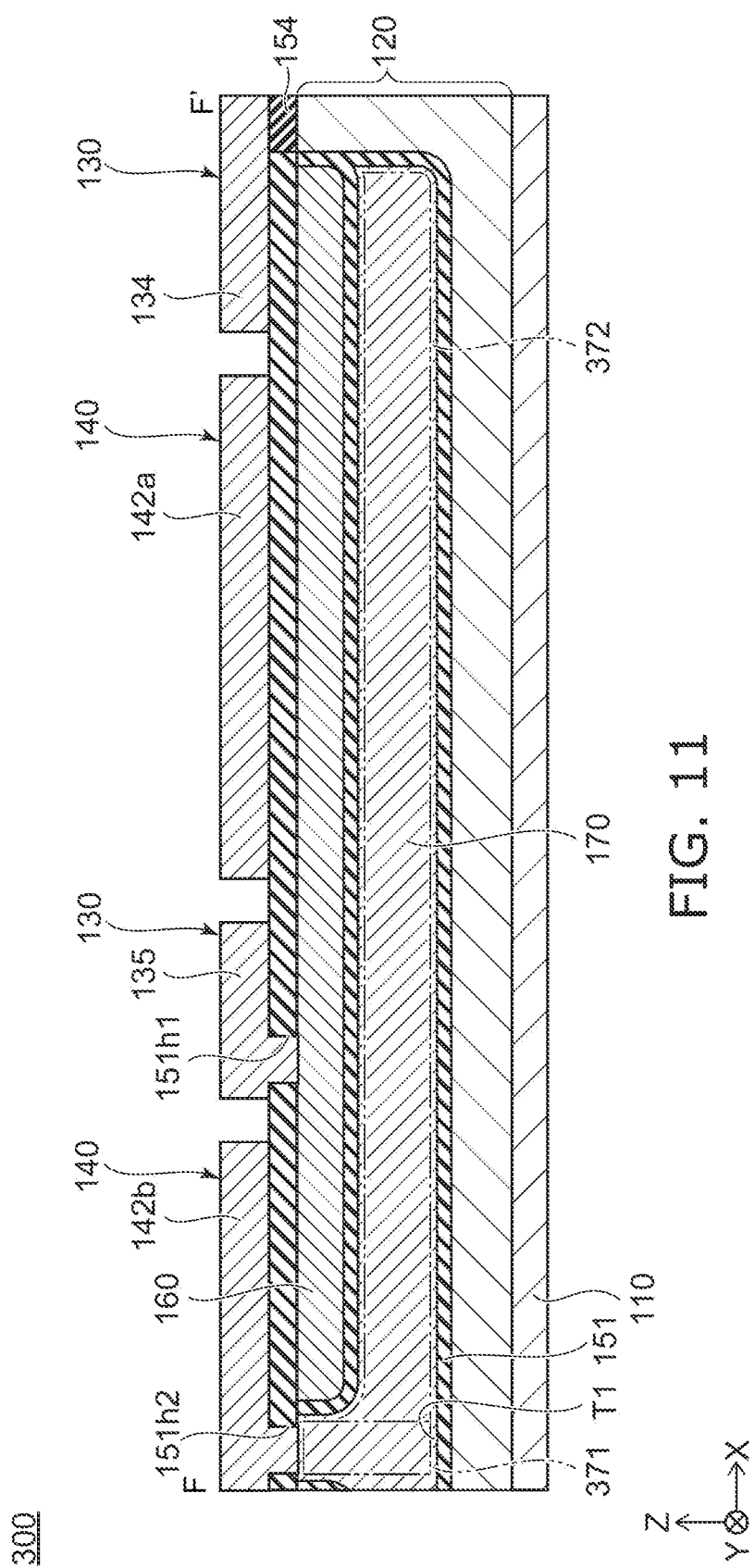
FIG. 11 is a cross-sectional view along line F-F' of FIG. 10.

FIG. 11 is a cross-sectional view along line F-F' of FIG. 10.

Figure 12:
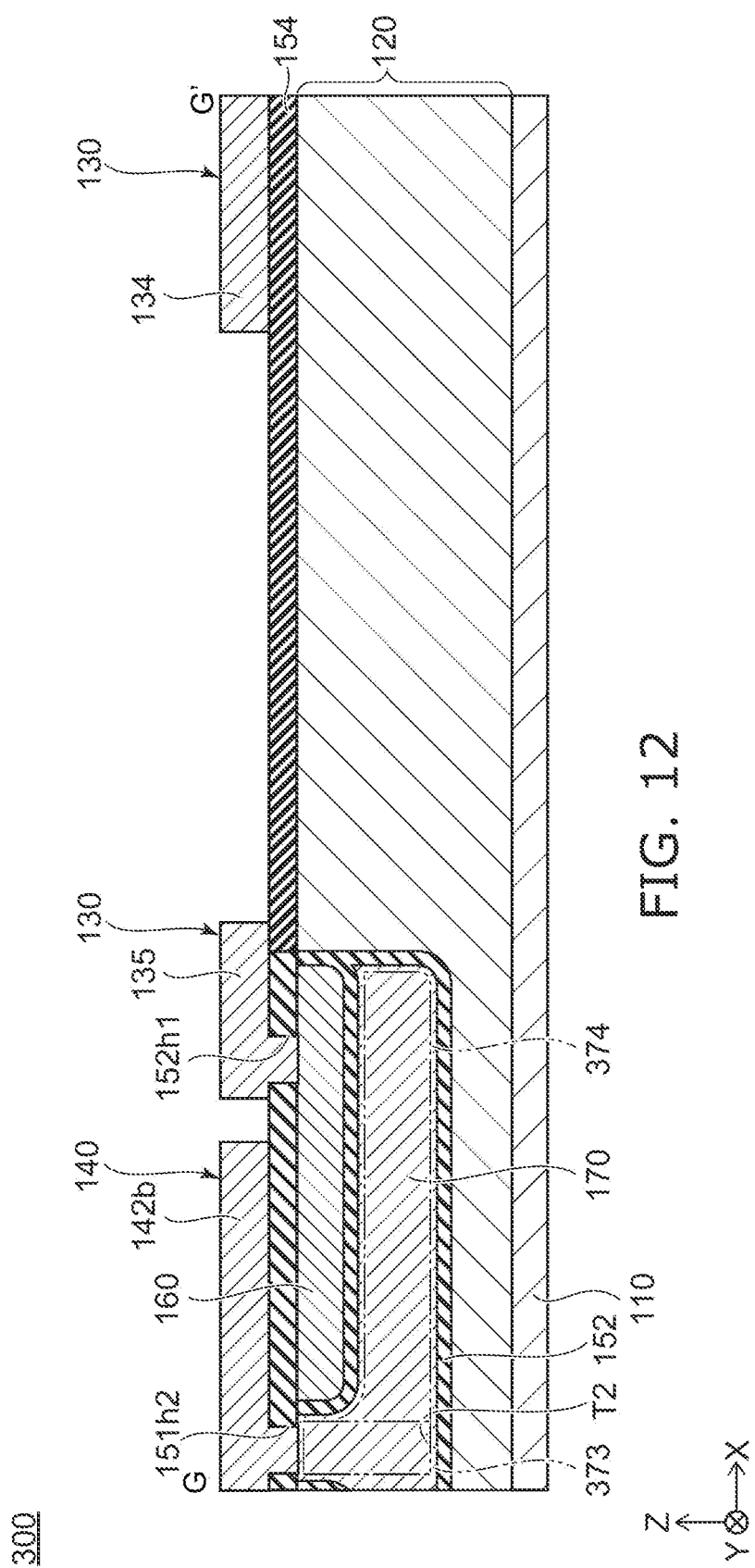
FIG. 12 is a cross-sectional view along line G-G' of FIG.

FIG. 12 is a cross-sectional view along line G-G' of FIG. 10.

The internal structures of the trenches T1, T2, T3, T4, and T5 of the semiconductor device 300 according to the embodiment are different from those of the semiconductor device 100 according to the first embodiment.

According to the embodiment, the internal gate electrode 160 that is in the trench T1 extends to a position that overlaps the third extension portion 134 when viewed from above. The +X direction end portion of this internal gate electrode 160 overlaps the third extension portion 134. Accordingly, the contact portion 120*a* is adjacent to this internal gate electrode 160. The length in the X-direction of the internal gate electrode 160 in the trench T2 is less than the length in the X-direction of the internal gate electrode 160 in the trench T1.

According to the embodiment, the protrusion 135 overlaps a portion of this internal gate electrode 160 between the two X-direction end portions when viewed from above. Similarly to the first embodiment, the protrusion 135 is connected to the portion of this internal gate electrode 160 between the two X-direction end portions via an opening 151*h* in the insulating film 151 in the trench T1. However, this internal gate electrode 160 may be connected to the third extension portion 134 instead of the protrusion 135. In such a case, it is sufficient to provide an opening in a portion of the insulating film 151 positioned between the third extension portion 134 and the +X direction end portion of this internal gate electrode 160. Also, in such a case, the protrusion 135 may not cover the trench T1. In other words, the protrusion 135 may be separated from the trench T1 in the +Y direction when viewed from above. This internal gate electrode 160 may be connected to both the protrusion 135 and the third extension portion 134.

As shown in FIGS. 10 and 11, the FP electrode 170 that is in the trench T1 includes a portion 371 that is next to the −X direction end portion of the internal gate electrode 160 in the −X direction, and a portion 372 that is linked to the +X direction end portion of the portion 371 and is located below the internal gate electrode 160.

Thus, the internal gate electrode 160 is located in the portion of the trench T1 that is positioned in the termination region. The internal gate electrode 160 may be located in the termination region according to the thickness of the termination region of the insulating film 151 and/or the breakdown voltage of the semiconductor device 100. This is similar for the other trenches T2 to T5 described below as well.

As shown in FIGS. 10 and 12, the FP electrode 170 that is in the trench T2 includes a portion 373 that is next to the −X direction end portion of the internal gate electrode 160 in the −X direction, and a portion 374 that is linked to the +X direction end portion of the portion 373 and is located below the internal gate electrode 160. The portion 373 is next to the portion 371 of the FP electrode 170 in the trench T1 in the Y-direction.

Thus, the internal gate electrode 160 is located also in the portion of the trench T2 that is positioned in the termination region.

As shown in FIG. 10, the arrangement of the FP electrode 170 in the trench T4 is similar to the arrangement of the FP electrode 170 in the trench T2. The arrangements of the FP electrodes 170 in the trenches T3 and T5 are similar to the arrangement of the FP electrode 170 in the trench T1.

Accordingly, a description of the internal configurations of the trenches T3, T4, and T5 is omitted.

Effects of the embodiment will now be described.

According to the embodiment as well, the pad portion 131 is separated in the +Y direction from the +X direction end portion of the internal gate electrode 160 in each trench T2. The distance L between the first covering portion 142a and the pad portion 131 in the Y-direction is greater than the distances L1 and L2 between the pad portion 131 and the trenches T2 in the Y-direction. The protrusion 135 protrudes from the pad portion 131, covers the +X direction end portion of the internal gate electrode 160 in each trench T2, and is connected to the +X direction end portion of the internal gate electrode 160 in each trench T2. Thus, the internal gate electrode 160 that is in each trench T2 and is positioned in the Y-direction between the position of the pad portion 131 in the Y-direction and the position of the first covering portion 142a in the Y-direction is not easily connected directly to the pad portion 131. According to the embodiment, such an internal gate electrode 160 can be electrically connected to the external gate electrode 130 by the protrusion 135. Also, the second covering portion 142b covers the contact portion 120b of the semiconductor part 120 between the internal gate electrode 160 in the trench T1 and the internal gate electrode 160 in the trench T2 positioned furthest toward the −Y side, and is connected to the contact portion 120b. Therefore, the effective element area can be increased.

The first covering portion 142a covers the contact portion 120a of the semiconductor part 120 adjacent to the internal gate electrode 160 in the trench T1, and is connected to the contact portion 120a. Therefore, the effective element area can be increased.

The configurations of the multiple embodiments described above can be combined as appropriate within the extent of technical feasibility. For example, the configuration of the third embodiment may be combined with the second embodiment.

Embodiments may include the following configurations (e.g., technological proposals).

Configuration 1

A semiconductor device, comprising:
a first electrode;
a semiconductor part located on the first electrode;
a second electrode located in the semiconductor part, the second electrode extending in a first direction when viewed from above;
a third electrode located in the semiconductor part, the third electrode extending in the first direction, the third electrode including a first portion, a second portion, and a first middle portion positioned below the second electrode between the first portion and the second portion, the second electrode being located between the first portion and the second portion in the first direction;
a fourth electrode located above the semiconductor part, the fourth electrode including
a pad portion separated from the second electrode and the second portion in a second direction crossing the first direction when viewed from above, and
a protrusion protruding from the pad portion and covering the second electrode, the protrusion being connected to the second electrode;
a fifth electrode located above the semiconductor part and separated from the fourth electrode, the fifth electrode including
a first covering portion covering a first contact portion of the semiconductor part adjacent to the second portion when viewed from above, the first covering portion being connected to the first contact portion, and
a second covering portion covering the first portion, the second covering portion being connected to the first portion; and
a first insulating film located between the semiconductor part and the second electrode, between the semiconductor part and the third electrode, and between the second electrode and the third electrode.

Configuration 2

The device according to the configuration 1, wherein
the first covering portion also covers the second portion, and
the first covering portion also is connected to the second portion.

Configuration 3

The device according to the configuration 1 or 2, wherein
the pad portion includes an end portion in a direction from the second portion toward the first portion, and
the protrusion protrudes from the end portion of the pad portion.

Configuration 4

The device according to any one of the configurations 1-3, wherein
a recess is provided in the fifth electrode,
the recess is positioned between the first covering portion and the second covering portion, and
the protrusion is located in the recess.

Configuration 5

The device according to any one of the configurations 1-4, further comprising:
a sixth electrode located in the semiconductor part, the sixth electrode being next to the second electrode in the second direction, the sixth electrode extending in the first direction; and
a seventh electrode located in the semiconductor part, the seventh electrode extending in the first direction, the seventh electrode including a third portion, a fourth portion, and a second middle portion positioned below the sixth electrode between the third portion and the fourth portion, the sixth electrode being located between the third portion and the fourth portion in the first direction; and
a second insulating film located between the semiconductor part and the sixth electrode, between the semiconductor part and the seventh electrode, and between the sixth electrode and the seventh electrode,
the protrusion covering the sixth electrode when viewed from above,
the protrusion being connected to the sixth electrode,
the third portion being next to the first portion in the second direction,
the second covering portion also covering the third portion when viewed from above,
the second covering portion also being connected to the third portion.

Configuration 6

The device according to the configuration 5, wherein
the second covering portion also covers a second contact portion of the semiconductor part positioned between the second electrode and the sixth electrode when viewed from above, and
the second covering portion also is connected to the second contact portion.

Configuration 7

The device according to the configuration 6, wherein
the semiconductor part includes:
a first semiconductor layer of a first conductivity type;
a second semiconductor layer located in an upper layer portion of the first semiconductor layer, the second semiconductor layer being next to the second electrode with the first insulating film interposed, the second semiconductor layer being of a second conductivity type; and
a third semiconductor layer located in an upper layer portion of the second semiconductor layer, the third semiconductor layer being of the first conductivity type,
the third semiconductor layer being located in the second contact portion.

Configuration 8

The device according to the configuration 7, wherein
the third semiconductor layer also is located under the first covering portion, and
the first covering portion also is connected to the third semiconductor layer.

Configuration 9

A semiconductor device, comprising:
a first electrode;
a semiconductor part located on the first electrode;
a second electrode located in the semiconductor part, the second electrode extending in a first direction when viewed from above;
a third electrode, the second electrode including a first end portion in an opposite direction of the first direction, the third electrode including a portion next to the first end portion;
a fourth electrode located in the semiconductor part, the fourth electrode being next to the first end portion of the second electrode in a second direction crossing the first direction when viewed from above, the fourth electrode extending in the first direction, a length in the first direction of the fourth electrode being less than a length in the first direction of the second electrode;
a fifth electrode, the fourth electrode including a second end portion in the opposite direction of the first direction, the fifth electrode including a portion next to the second end portion in the first direction;
a sixth electrode located above the semiconductor part, the sixth electrode being connected to the fourth electrode, the sixth electrode including a pad portion and a protrusion, the pad portion being separated from the second and fourth electrodes in the second direction, the protrusion protruding from the pad portion, the fourth electrode including a third end portion in the first direction, the protrusion covering the third end portion, the protrusion being connected to the third end portion; and
a seventh electrode located above the semiconductor part, the seventh electrode being separated from the pad portion in an opposite direction of the second direction, the seventh electrode including a first covering portion and a second covering portion, a distance from the pad portion to the first covering portion in the second direction being greater than a distance between the fourth electrode and the pad portion in the second direction, the second covering portion covering the portion of the third electrode, the portion of the fifth electrode, and a first contact portion of the semiconductor part, the first contact portion being positioned between the second electrode and the fourth electrode, the second covering portion being connected to the portion of the third electrode, the portion of the fifth electrode, and the first contact portion;
a first insulating film located between the semiconductor part and the second electrode, between the semiconductor part and the third electrode, and between the second electrode and the third electrode; and
a second insulating film located between the semiconductor part and the fourth electrode, between the semiconductor part and the fifth electrode, and between the fourth electrode and the fifth electrode.

Configuration 10

The device according to the configuration 9, wherein
the first covering portion covers a second contact portion of the semiconductor part,
the second contact portion is adjacent to the second electrode, and
the first covering portion is connected to the second contact portion.

Configuration 11

A semiconductor device, comprising:
a first electrode;
a semiconductor part located on the first electrode;
a second electrode located in the semiconductor part, the second electrode extending in a first direction when viewed from above;
a third electrode located in the semiconductor part, the third electrode extending in the first direction, the third electrode including a first portion, a second portion, and a first middle portion, the second electrode including a first end portion in an opposite direction of the first direction, the first portion being next to the first end portion in the first direction, the second electrode including a second end portion in the first direction, the second portion being next to the second end portion in the first direction, the first middle portion being positioned below the second electrode between the first portion and the second portion;
a fourth electrode located in the semiconductor part, the fourth electrode being next to the second electrode in a second direction crossing the first direction when viewed from above, the fourth electrode extending in the first direction;
a fifth electrode located in the semiconductor part, the fourth electrode including a third end portion in the opposite direction of the first direction, the fifth electrode including a third portion that is next to the third end portion in the first direction;

a sixth electrode located above the semiconductor part, the sixth electrode including a pad portion and a protrusion, the pad portion being separated in the second direction from the second and fourth electrodes, the protrusion protruding from the pad portion, the fourth electrode including a fourth end portion in the first direction, the protrusion covering the second end portion of the second electrode and the fourth end portion of the fourth electrode, the protrusion being connected to the second and fourth end portions, the protrusion not covering at least a portion of the second portion when viewed from above;

a seventh electrode located above the semiconductor part and separated from the pad portion in an opposite direction of the second direction, the seventh electrode including a first covering portion and a second covering portion, a distance from the pad portion to the first covering portion in the second direction being greater than a distance between the fourth electrode and the pad portion in the second direction, the second covering portion covering the first portion, the third portion, and a first contact portion of the semiconductor part positioned between the second electrode and the fourth electrode, the second covering portion being connected to the first portion, the third portion, and the first contact portion;

a first insulating film located between the semiconductor part and the second electrode, between the semiconductor part and the third electrode, and between the second electrode and the third electrode; and a second insulating film located between the semiconductor part and the fourth electrode, between the semiconductor part and the fifth electrode, and between the fourth electrode and the fifth electrode.

Configuration 12

The device according to the configuration 11, wherein
the first covering portion covers a second contact portion of the semiconductor part,
the second contact portion is adjacent to the second portion, and
the first covering portion is connected to the second contact portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
a first electrode;
a semiconductor part located on the first electrode;
a second electrode located in the semiconductor part, the second electrode extending in a first direction when viewed from above;
a third electrode located in the semiconductor part, the third electrode extending in the first direction, the third electrode including a first portion, a second portion, and a first middle portion positioned below the second electrode between the first portion and the second portion, the second electrode being located between the first portion and the second portion in the first direction;
a fourth electrode located above the semiconductor part, the fourth electrode including
a pad portion separated from the second electrode and the second portion in a second direction crossing the first direction when viewed from above, and
a protrusion protruding from the pad portion and covering the second electrode, the protrusion being connected to the second electrode;
a fifth electrode located above the semiconductor part and separated from the fourth electrode, the fifth electrode including
a first covering portion covering a first contact portion of the semiconductor part adjacent to the second portion when viewed from above, the first covering portion being connected to the first contact portion, and
a second covering portion covering the first portion, the second covering portion being connected to the first portion; and
a first insulating film located between the semiconductor part and the second electrode, between the semiconductor part and the third electrode, and between the second electrode and the third electrode;
wherein the pad portion includes an end portion in a direction from the second portion toward the first portion, and the protrusion protrudes from the end portion of the pad portion.

2. The device according to claim 1, wherein
the first covering portion also covers the second portion, and
the first covering portion also is connected to the second portion.

3. The device according to claim 1, wherein
a recess is provided in the fifth electrode, the recess is positioned between the first covering portion and the second covering portion, and
the protrusion is located in the recess.

4. The device according to claim 1, further comprising:
a sixth electrode located in the semiconductor part, the sixth electrode being next to the second electrode in the second direction, the sixth electrode extending in the first direction; and
a seventh electrode located in the semiconductor part, the seventh electrode extending in the first direction, the seventh electrode including a third portion, a fourth portion, and a second middle portion positioned below the sixth electrode between the third portion and the fourth portion, the sixth electrode being located between the third portion and the fourth portion in the first direction; and
a second insulating film located between the semiconductor part and the sixth electrode, between the semiconductor part and the seventh electrode, and between the sixth electrode and the seventh electrode,
the protrusion covering the sixth electrode when viewed from above,
the protrusion being connected to the sixth electrode,
the third portion being next to the first portion in the second direction,
the second covering portion also covering the third portion when viewed from above, the second covering portion also being connected to the third portion.

5. The device according to claim 4, wherein
the second covering portion also covers a second contact portion of the semiconductor part positioned between the second electrode and the sixth electrode when viewed from above, and
the second covering portion also is connected to the second contact portion.

6. The device according to claim 5, wherein the semiconductor part includes:
a first semiconductor layer of a first conductivity type;
a second semiconductor layer located in an upper layer portion of the first semiconductor layer, the second semiconductor layer being next to the second electrode with the first insulating film interposed, the second semiconductor layer being of a second conductivity type; and
a third semiconductor layer located in an upper layer portion of the second semiconductor layer, the third semiconductor layer being of the first conductivity type,
the third semiconductor layer being located in the second contact portion.

7. The device according to claim 6, wherein
the third semiconductor layer also is located under the first covering portion, and
the first covering portion also is connected to the third semiconductor layer.

\* \* \* \* \*